United States Patent
Chen et al.

(10) Patent No.: US 10,477,965 B1
(45) Date of Patent: Nov. 19, 2019

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/205,229

(22) Filed: Nov. 30, 2018

(30) Foreign Application Priority Data

Jul. 27, 2018 (TW) .............................. 107126413 A (51) Int. Cl.
- *A47B 88/43* (2017.01)
- *A47B 88/493* (2017.01)
- *H05K 7/18* (2006.01)
- *H05K 7/14* (2006.01)
- *A47B 88/477* (2017.01)

(52) U.S. Cl.
CPC .......... *A47B 88/43* (2017.01); *A47B 88/477* (2017.01); *A47B 88/493* (2017.01); *H05K 7/1489* (2013.01); *H05K 7/183* (2013.01); *A47B 2210/0081* (2013.01)

(58) Field of Classification Search
CPC ..... A47B 88/43; A47B 88/493; A47B 88/477; A47B 88/40; A47B 88/49; H05K 7/1489
See application file for complete search history.

(56) References Cited

U.S. PATENT DOCUMENTS

| | | | |
|---|---|---|---|
| 6,997,611 B2 | 2/2006 | Chen | |
| 7,357,468 B2* | 4/2008 | Hwang | A47B 88/49 312/333 |
| 8,240,789 B2* | 8/2012 | Chen | F16C 29/046 312/333 |
| 9,247,815 B2* | 2/2016 | Chen | A47B 88/49 |
| 10,041,535 B2 | 8/2018 | Chen | |

(Continued)

FOREIGN PATENT DOCUMENTS

| | | |
|---|---|---|
| EP | 3 275 338 A1 | 1/2018 |
| EP | 3 307 038 A1 | 4/2018 |

*Primary Examiner* — Kimberley S Wright
(74) *Attorney, Agent, or Firm* — Winston Hsu (57) ABSTRACT

A slide rail assembly includes a first rail, a second rail and a positioning device. The first rail includes a first structure and a second structure. The second rail is movable relative to the first rail. The positioning device is arranged to the second rail and includes an elastic member and a positioning member. The elastic member provides an elastic force to the positioning member. When the second rail is moved relative to the first rail from a first position to a second position, the positioning member is moved to an engaging position through the elastic force and abuts against the first structure. When the second rail is moved relative to the first rail from the second position to a third position, the positioning member is moved from the engaging position to a disengaging position and no longer abuts against the first structure by guidance of the second structure.

19 Claims, 10 Drawing Sheets

(56) References Cited

U.S. PATENT DOCUMENTS

| | | | |
|---|---|---|---|
| 2003/0080659 A1* | 5/2003 | Judge | A47B 88/493 312/334.47 |
| 2003/0178922 A1* | 9/2003 | Chen | A47B 88/4936 312/334.44 |
| 2005/0116594 A1* | 6/2005 | Barry, Jr. | H05K 7/1489 312/334.4 |
| 2006/0288529 A1* | 12/2006 | Chen | A47B 88/493 16/96 R |
| 2007/0164644 A1* | 7/2007 | Hwang | A47B 88/49 312/333 |
| 2007/0170829 A1* | 7/2007 | Chen | A47B 88/467 312/334.1 |
| 2009/0169140 A1* | 7/2009 | Chen | A47B 88/493 384/21 |
| 2011/0091141 A1* | 4/2011 | Liang | H05K 7/1489 384/20 |
| 2011/0135224 A1* | 6/2011 | Chen | F16C 29/04 384/26 |
| 2011/0280506 A1* | 11/2011 | Chen | F16C 29/046 384/10 |
| 2012/0163740 A1 | 6/2012 | Yu | |
| 2018/0070723 A1 | 3/2018 | Chen | |

\* cited by examiner

SLIDE RAIL ASSEMBLY

BACKGROUND OF THE INVENTION

1. Field of the Invention

The present invention relates to a slide rail assembly, and more particularly, to a slide rail assembly comprising at least two slide rails.

2. Description of the Prior Art

A slide rail assembly is widely used. For example, it can be used to mount a drawer movable relative to a cabinet, or to mount a chassis of an electric apparatus movable relative to a rack (or a cabinet). Wherein, the slide rail assembly commonly has three slide rails and composes a so-called three-slide-rail assembly.

For example, the three-slide-rail assembly comprises a first rail, a second rail and a third rail movably connected to each other. Wherein, the second rail can be located at an extending position relative to the first rail, and when the second rail is located at the extending position, the second rail and the first rail usually have engaging means collocating with each other to prevent the second rail from being opened or retracted arbitrarily relative to the first rail in a direction. Conventional methods to sever the engagement usually take advantage of displacement of the third rail to sever an engaging relationship of the engaging means. Otherwise, users operate related components of the engaging means in a manual manner directly to sever the engaging relationship of the engaging means.

U.S. Pat. No. 6,997,611 B2 of Chen et al. discloses a positioning device 6 disposed to an intermediate slide track 2. When an inner slide track 1 and the intermediate slide track 2 are pulled relative to an outer slide track 3 to an extending position, the intermediate slide track 2 is held in an extending positioning state relative to the outer slide track 3. For retraction operation, the prior art discloses that the positioning state is severed through the inner slide track retracted relative to the intermediate slide track such that the inner slide track and the intermediate slide track are retractable relative to the outer slide track. However, when the inner slide track is detached from the intermediate slide track, the intermediate slide track is still in the extending state relative to the outer slide track. If the users want to retract the intermediate slide track relative to the outer slide track, they have to stretch their hands to the rear of the intermediate slide track to directly operate the positioning device and sever the positioning relationship between the intermediate slide track and the outer slide track to enable the intermediate slide track to be retracted relative to the outer slide track. Obviously, the operation is not very convenient. Especially when slide tracks have been mounted to a rack, the operation which needs the users to stretch their hands into the rack to sever the positioning relationship between the intermediate slide track and the outer slide track lacks convenience for personnel.

In view of this, how to develop a different slide rail product depending on various market demands has become a discussable issue.

SUMMARY OF THE INVENTION

The present invention relates to a slide rail assembly comprising at least two slide rails.

According to an embodiment of the present invention, a slide rail assembly comprises a first rail, a second rail and a positioning device. The first rail comprises a first structure and a second structure. The second rail is movable relative to the first rail. The positioning device is arranged to the second rail and comprises an elastic member and a positioning member. The positioning member is located at an initial position in response to an elastic force generated by the elastic member. When the second rail is moved relative to the first rail from a first position to a second position in a first direction, the positioning member is moved from the initial position to an engaging position through the elastic force released by the elastic member and abuts against the first structure of the first rail. When the second rail is moved relative to the first rail from the second position to a third position in the first direction, the positioning member is moved from the engaging position to a disengaging position by guidance of the second structure of the first rail and no longer abuts against the first structure of the first rail.

Preferably, the slide rail assembly further comprises a third rail movable relative to the second rail and a synchronizing member pivoted to the second rail. The third rail has a synchronizing feature. The second rail and the third rail are capable of being moved synchronously by means of abutting between the synchronizing feature and the synchronizing member.

Preferably, the first rail further comprises a first severing feature. When the second rail is located at the second position relative to the first rail, the first severing feature of the first rail is configured to sever a synchronous relationship between the second rail and the third rail.

Preferably, the first severing feature comprises an incline or a cambered surface, and the synchronizing member is deflectable through contacting the first severing feature to serve the synchronous relationship between the second rail and the third rail.

Preferably, the first structure is a hole or a concaved portion. The second structure is adjacent to the first structure, and the second structure comprises an incline or a cambered surface.

Preferably, the first position is a retracted position, the second position is a first extending position, and the third position is a second extending position.

Preferably, the slide rail assembly further comprises a holding member arranged to the second rail. The positioning member is pivoted to the second rail. When the positioning member is located at the disengaging position, the positioning member can be held at the disengaging position by the holding member.

Preferably, the holding member has a flexible portion. The flexible portion is able to exert a holding force to the positioning member.

Preferably, the first rail further comprises a second severing feature. When the second rail is moved relative to the first rail to the first position in a second direction, the positioning member is released from the holding force and moved from the disengaging position back to the initial position by guidance of the second severing feature of the first rail.

Preferably, the second severing feature of the first rail is an incline or a cambered surface.

Preferably, the slide rail assembly further comprises an operating member arranged to the first rail. The operating member comprises a first blocking portion. The second rail has a second blocking portion. When the second rail is moved relative to the first rail to the second position, the first blocking portion and the second blocking portion obstruct each other to prevent the second rail from being moved in the first direction.

Preferably, the operating member is operable to drive the first blocking portion to leave the blocking position and no longer obstruct the second blocking portion of the second rail such that the second rail is movable relative to the first rail to the third position in the first direction.

Preferably, the slide rail assembly further comprises an auxiliary sliding device arranged between the first rail and the second rail. The auxiliary sliding device comprises a pair of bead strips. Each bead strip comprises a plurality of balls configured to support the first rail and the second rail.

Preferably, the second rail has a rear blocking portion corresponding to a rear end of the each bead strip. The first rail has a front blocking portion corresponding to a front end of the each bead strip. The each bead strip is located between the front blocking portion of the first rail and the rear blocking portion of the second rail. When the second rail is located at the second position relative to the first rail, a clearance is between the front end of the each bead strip and the front blocking portion of the first rail.

According to another embodiment of the present invention, a slide rail assembly comprises a first rail, a second rail, a third rail, an operating member, a positioning device and a synchronizing member. The first rail comprises a first structure, a second structure and a first severing feature. The second rail is movable relative to the first rail. The third rail is movable relative to the second rail and has a synchronizing feature. The operating member is arranged to the first rail and comprises a first blocking portion. The second rail has a second blocking portion. The positioning device is arranged to the second rail and comprises an elastic member and a positioning member. The positioning member is located at an initial position in response to an elastic force generated by the elastic member. The synchronizing member is arranged to the second rail. The second rail and the third rail are movable relative to the first rail synchronously from a first position to a second position in a first direction by means of abutting between the synchronizing feature and the synchronizing member until the first severing feature of the first rail severs a synchronous relationship between the second rail and the third rail. When the second rail and the third rail are at the second position, the positioning member is moved from the initial position to an engaging position through the elastic force released by the elastic member and abuts against the first structure of the first rail to prevent the second rail from being moved relative to the first rail in a second direction, and when the first blocking portion of the operating member is located at a blocking position, the first blocking portion and the second blocking portion are able to obstruct each other to prevent the second rail from being moved in the first direction. The operating member is operable to drive the first blocking portion to leave the blocking position and no longer obstruct the second blocking portion such that the second rail is movable relative to the first rail to a third position in the first direction. The positioning member is moved from the engaging position to a disengaging position by guidance of the second structure of the first rail and no longer abuts against the first structure of the first rail.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
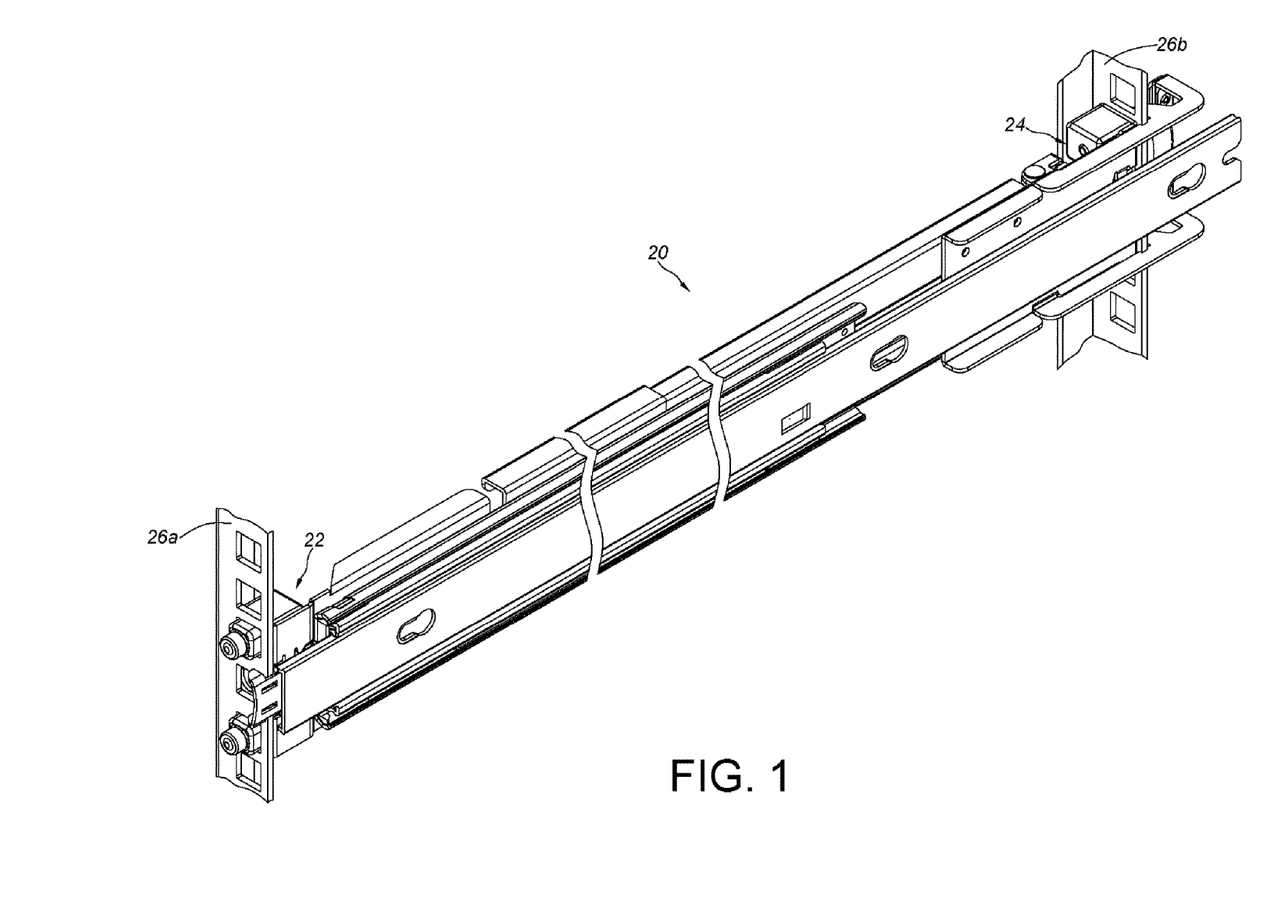
FIG. 1 is a diagram showing a slide rail assembly according to an embodiment of the present invention mounted to a rack.

As shown in FIG. 1, a slide rail assembly 20 according to an embodiment of the present invention can be mounted to a rack. Specifically, the slide rail assembly 20 can be mounted to a first post 26a and a second post 26b of the rack through a first bracket 22 and a second bracket 24.

Figure 2:
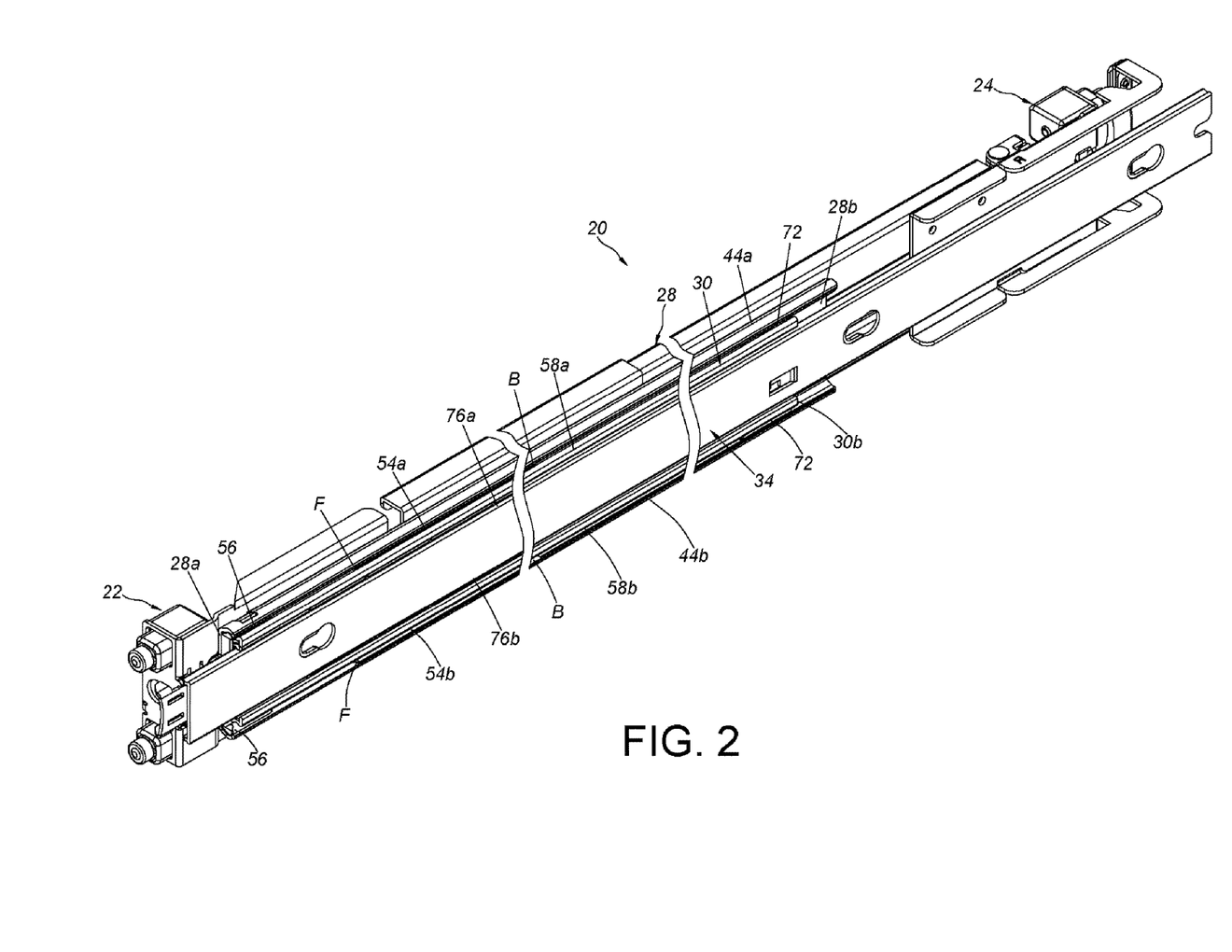
FIG. 2 is a diagram showing a composition of the slide rail assembly according to the embodiment of the present invention.
Figure 3:
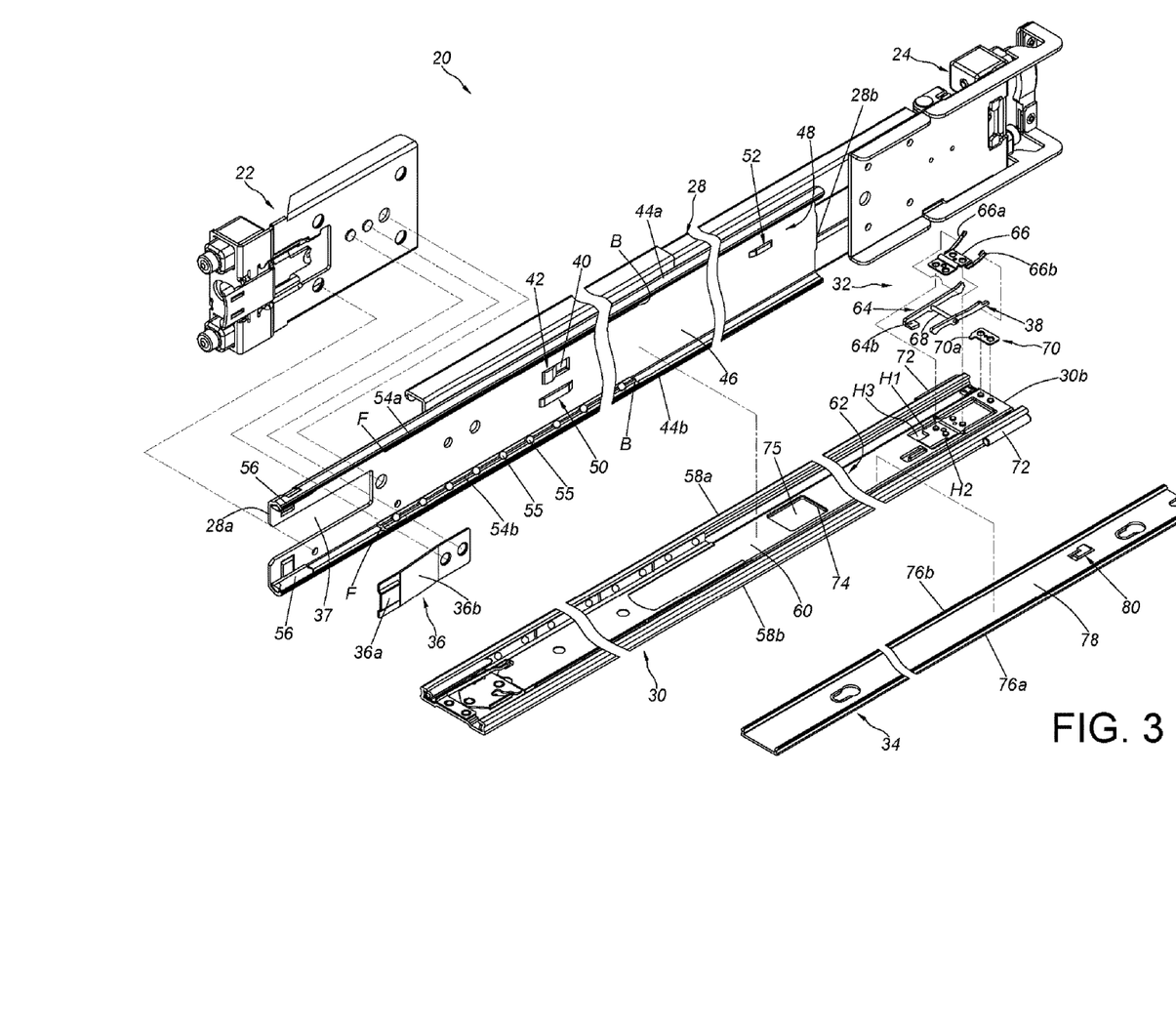
FIG. 3 is a diagram showing a decomposition of the slide rail assembly according to the embodiment of the present invention.

As shown in FIG. 2 and FIG. 3, the slide rail assembly 20 comprises a first rail 28, a second rail 30 and a positioning device 32. Preferably, the slide rail assembly 20 further comprises a third rail 34, an operating member 36 and a synchronizing member 38.

The first rail 28 comprises a first structure 40 and a second structure 42. Preferably, the first rail 28 has a first wall 44a, a second wall 44b and a side wall 46 connected between the first wall 44a and the second wall 44b. The first wall 44a, the second wall 44b and the side wall 46 of the first rail 28 cooperatively define a passage 48. Preferably, the first rail 28 further comprises a first severing feature 50 and a second severing feature 52.

Preferably, the first structure 40, the second structure 42, the first severing feature 50 and the second severing feature 52 are arranged to the side wall 46 and in the passage 48. Preferably, the first structure 40 and the second structure 42 are located between a front portion 28a and a rear portion 28b of the first rail 28. Preferably, the first structure 40 is adjacent to the second structure 42. Preferably, the first structure 40 is a hole or a concaved portion, and the second structure 42 comprises an incline or a cambered surface. Preferably, the first severing feature 50 is parallel to the first structure 40 (the second structure 42). Preferably, the first severing feature 50 comprises an incline or a cambered surface. Preferably, the second severing feature 52 is arranged adjacently to the rear portion 28b of the first rail 28. Preferably, the second severing feature 52 comprises an incline or a cambered surface.

It is notable that the second bracket 24 is adjustably arranged adjacently to the rear portion 28b of the first rail 28. On the other hand, the first bracket 22 is attached adjacently to the front portion 28a of the first rail 28. For example, the first bracket 22 is fixed adjacently to the front portion 28a of the first rail 28 through riveting, welding and so on. Therefore, the first bracket 22 can be regarded as a part of the first rail 28. Preferably, the operating member 36 is arranged to the first bracket 22 of the first rail 28, and the operating member 36 comprises a first blocking portion 36a. Preferably, the operating member 36 further comprises a resilient portion 36b. The first blocking portion 36a is arranged to the resilient portion 36b, but is not limited thereto. Preferably, a position of the resilient portion 36b is corresponding to a space 37 of the first rail 28. The space 37 communicates the passage 48 of the first rail 28.

The second rail 30 is movable longitudinally relative to the first rail 28. For example, the second rail 30 is movably mounted into the passage 48 of the first rail 28. Preferably, the second rail 30 has a first wall 58a, a second wall 58b and a side wall 60 connected between the first wall 58a and the second wall 58b. The first wall 58a, the second wall 58b and the side wall 60 of the second rail 30 cooperatively define a passage 62. Positions of the first wall 58a, the second wall 58b and the side wall 60 of the second rail 30 are corresponding to the first wall 44a, the second wall 44b and the side wall 46 of the first rail 28, respectively.

Figure 4:
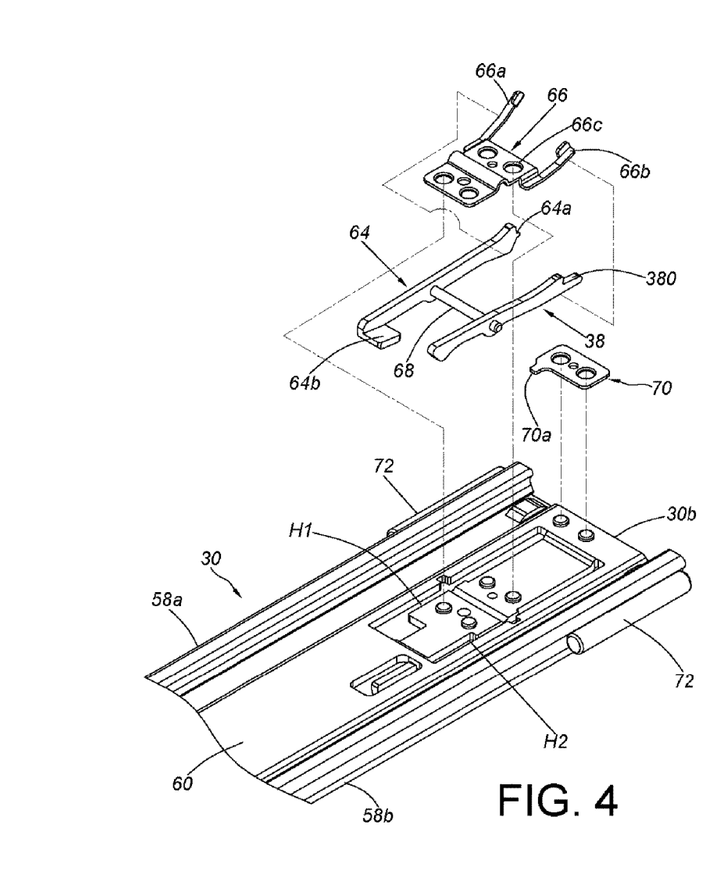
FIG. 4 is a diagram showing a decomposition of a positioning device, a synchronizing member, a holding member and a second rail of the slide rail assembly according to the embodiment of the present invention.
Figure 5:
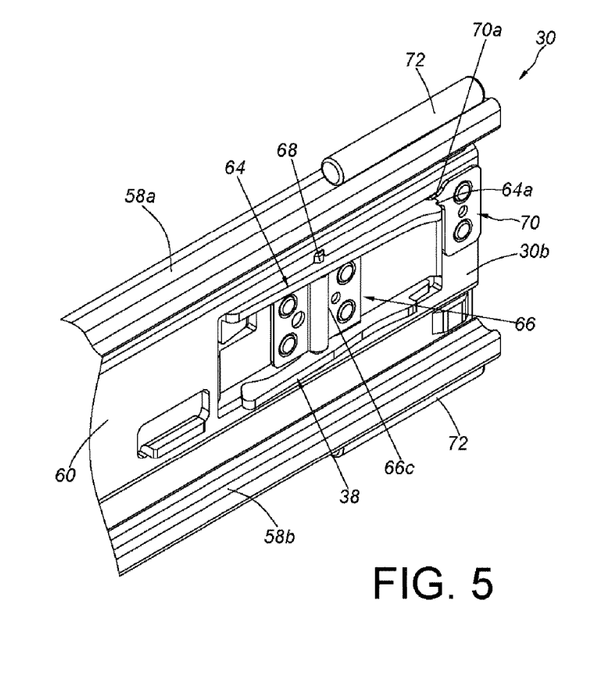
FIG. 5 is a diagram showing a composition of the positioning device, the synchronizing member, the holding member and the second rail of the slide rail assembly according to the embodiment of the present invention.

The positioning device 32 is arranged to the second rail 30. The positioning device 32 comprises a positioning member 64 and an elastic member 66 (this part can be referred to FIG. 4 and FIG. 5). Wherein, the elastic member 66 comprises a first elastic section 66a configured to provide an elastic force to the positioning member 64. Preferably, the elastic member 66 further comprises a second elastic section 66b configured to provide an elastic force to the synchronizing member 38. Preferably, the elastic member 66 is connected (e.g. fixed) to the side wall 60 of the second rail 30 through a connecting section 66c. Preferably, the positioning member 64 and the synchronizing member 38 are pivoted to the second rail 30, and the positioning member 64 and the synchronizing member 38 are rotatable relative to each other. Hereby, the positioning member 64 and the synchronizing member 38 are pivoted to the side wall 60 of the second rail 30 via a shaft 68, and the positioning member 64 and the synchronizing member 38 rotate relative to each other as an example in the embodiment, but the present invention is not limited thereto. Preferably, the side wall 60 of the second rail 30 has a first hole H1, a second hole H2 and a third hole H3. Positions of the first hole H1 and the second hole H2 are corresponding to the positioning member 64 and the synchronizing member 38, respectively. The third hole H3 communicates with the first hole H1, and a position of the third hole H3 is corresponding to a third structure 64b of the positioning member 64. Preferably, the positioning member 64 and the synchronizing member 38 are located adjacently to a rear portion 30b of the second rail 30. Preferably, the slide rail assembly 20 further comprises a holding member 70 arranged to the second rail 30, and the holding member 70 has a flexible portion 70a. The flexible portion 70a is able to collaborate with an extending section 64a of the positioning member 64, and the third structure 64b of the positioning member 64 and the extending section 64a are two ends of the positioning member 64, respectively. Preferably, the second rail 30 has a second blocking portion 74. The second blocking portion 74 is configured to collaborate with the first blocking portion 36a of the operating member 36. Preferably, the second blocking portion 74 is a wall around a through hole 75 of the second rail 30. Preferably, the slide rail assembly 20 further comprises an auxiliary sliding device arranged between the first rail 28 and the second rail 30 to promote smoothness of motion of the second rail 30 relative to the first rail 28. Preferably, the auxiliary sliding device comprises a first bead strip 54a and a second bead strip 54b. Wherein, the first bead strip 54a slidably abuts against the first wall 44a of the first rail 28 and the first wall 58a of the second rail 30 and is located therebetween; the second bead strip 54b slidably abuts against the second wall 44b of the first rail 28 and the second wall 58b of the second rail 30 and is located therebetween. Each bead strip 54a, 54b has a predetermined longitudinal length and comprises a plurality of balls 55. Preferably, a front blocking portion 56 of the first rail 28 is disposed adjacently to the front portion 28a of the first rail 28. Preferably, a pair of front blocking portions 56 are located on the first wall 44a and the second wall 44b of the first rail 28 as an example in the embodiment, and the pair of front blocking portions 56 are corresponding to front ends F of the first bead strip 54a and the second bead strip 54b. Preferably, a rear blocking portion 72 of the second rail 30 is disposed adjacently to a rear portion 30a of the second rail 30. Preferably, a pair of rear blocking portions 72 are located on the first wall 58a and the second wall 58b of the second rail 30 as an example in the embodiment, and the pair of rear blocking portions 72 are corresponding to rear ends B of the first bead strip 54a and the second bead strip 54b.

The third rail 34 can be moved longitudinally relative to the second rail 30. For example, the third rail 34 is movably mounted into the passage 62 of the second rail 30. Preferably, the third rail 34 has a first wall 76a, a second wall 76b and a side wall 78 connected between the first wall 76a and the second wall 76b. Positions of the first wall 76a, the second wall 76b and the side wall 78 of the third rail 34 are corresponding to the first wall 58a, the second wall 58b and the side wall 60 of the second rail 30, respectively. Preferably, the third rail 34 has a synchronizing feature 80 configured to collaborate with the synchronizing member 38.

Preferably, the synchronizing feature 80 is arranged to the side wall 78 of the third rail 34 as a protruded portion.

As shown in FIG. 3, FIG. 4, FIG. 6 and FIG. 7, the slide rail assembly 20 is in a retracted state. Specifically, the second rail 30 (and the third rail 34) is located at a first position P1 relative to the first rail 28 (e.g. a retracted position), but it is not limited thereto. Wherein, the positioning member 64 is able to be located at an initial position S1 in response to the elastic force generated by the first elastic section 66a of the elastic member 66, and the third structure 64b of the positioning member 64 is able to abut against the side wall 46 of the first rail 28 via the third hole H3 on the side wall 60 of the second rail 30. Wherein, when the positioning member 64 is located at the initial position S1, the extending section 64a of the positioning member 64 is adjacent to the flexible portion 70a of the holding member 70.

Figure 6:
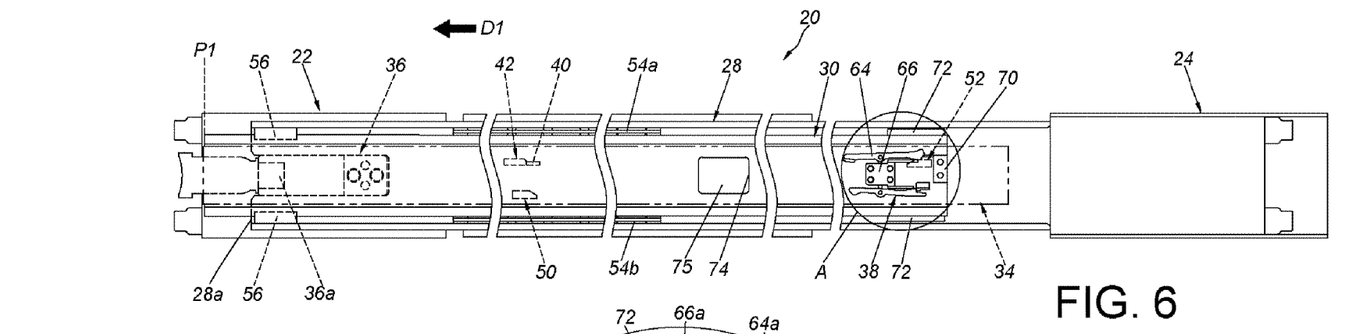
FIG. 6 is a diagram showing the second rail and a third rail retracted relative to a first rail of the slide rail assembly according to the embodiment of the present invention.
Figure 7:
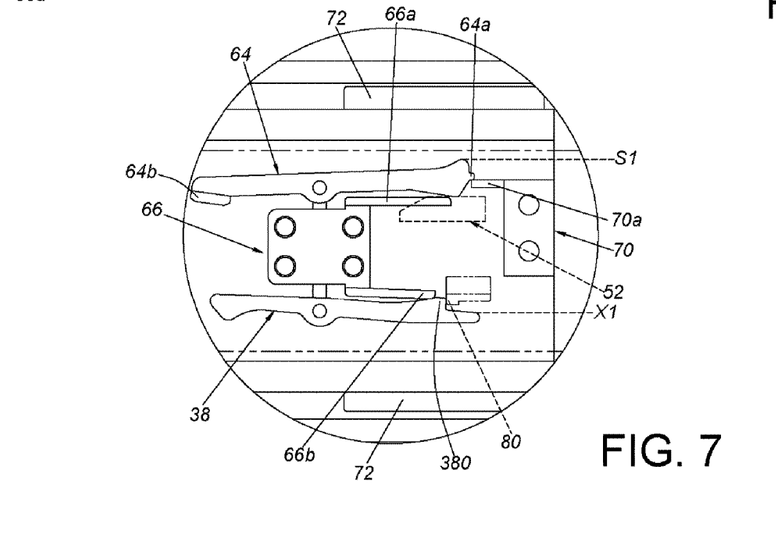
FIG. 7 is a partial enlarged diagram showing zone A in FIG. 6.

Preferably, when the second rail 30 is located at the first position P1 relative to the first rail 28, a portion of the second severing feature 52 of the first rail 28 can support the positioning member 64. Besides, a predetermined distance is between the positioning member 64 and the first structure 40 and the second structure 42 of the first rail 28. On the other hand, the synchronizing member 38 is able to be in an initial state X1 in response to the elastic force generated by the second elastic section 66b of the elastic member 66. Wherein, when being in the initial state X1, the synchronizing feature 80 is able to abut against an engaging section 380 of the synchronizing member 38 so as to make the second rail 30 and the third rail 34 moved synchronously in a first direction D1. In addition, a predetermined distance is between the synchronizing member 38 and the first severing feature 50 of the first rail 28, and a predetermined distance is between the second blocking portion 74 of the second rail 30 and the first blocking portion 36a of the operating member 36. Besides, the first bead strip 54a and the second bead strip 54b are located between the front blocking portion 56 of the first rail 28 and the rear blocking portion 72 of the second rail 30.

Figures 8, 9:
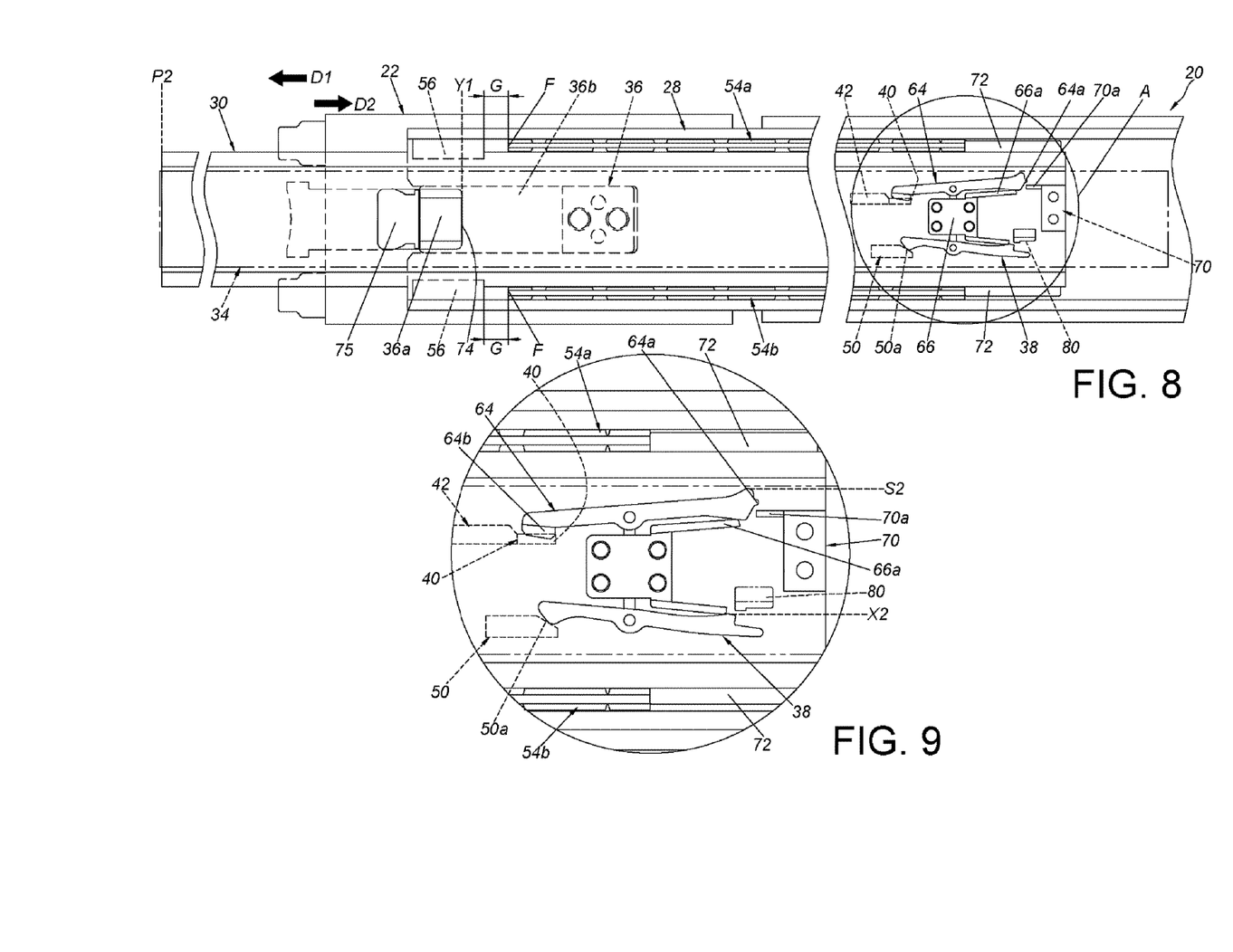
FIG. 8 is a diagram showing the second rail and the third rail moved synchronously relative to the first rail to a position in a first direction according to the embodiment of the present invention.
FIG. 9 is a partial enlarged diagram showing zone A in FIG. 8.

As shown in FIGS. 6-9, when the second rail 30 and the third rail 34 are moved synchronously relative to the first rail 28 from the first position P1 to a second position P2 (e.g. a first extending position) in the first direction D1, the positioning member 64 is moved from the initial position S1 (as shown in FIG. 6 or FIG. 7) to an engaging position S2 through the elastic force released by the first elastic section 66a of the elastic member 66 so as to drive the third structure 64b of the positioning member 64 to abuts against the first structure 40 of the first rail 28 (as shown in FIG. 8 or FIG. 9) to prevent the second rail 30 from being moved relative to the first rail 28 in a second direction D2 opposite to the first direction D1. Wherein, when the positioning member 64 is located at the engaging position S2, the extending section 64a of the positioning member 64 slightly tilts up relative to the flexible portion 70a of the holding member 70.

Figures 10, 11:
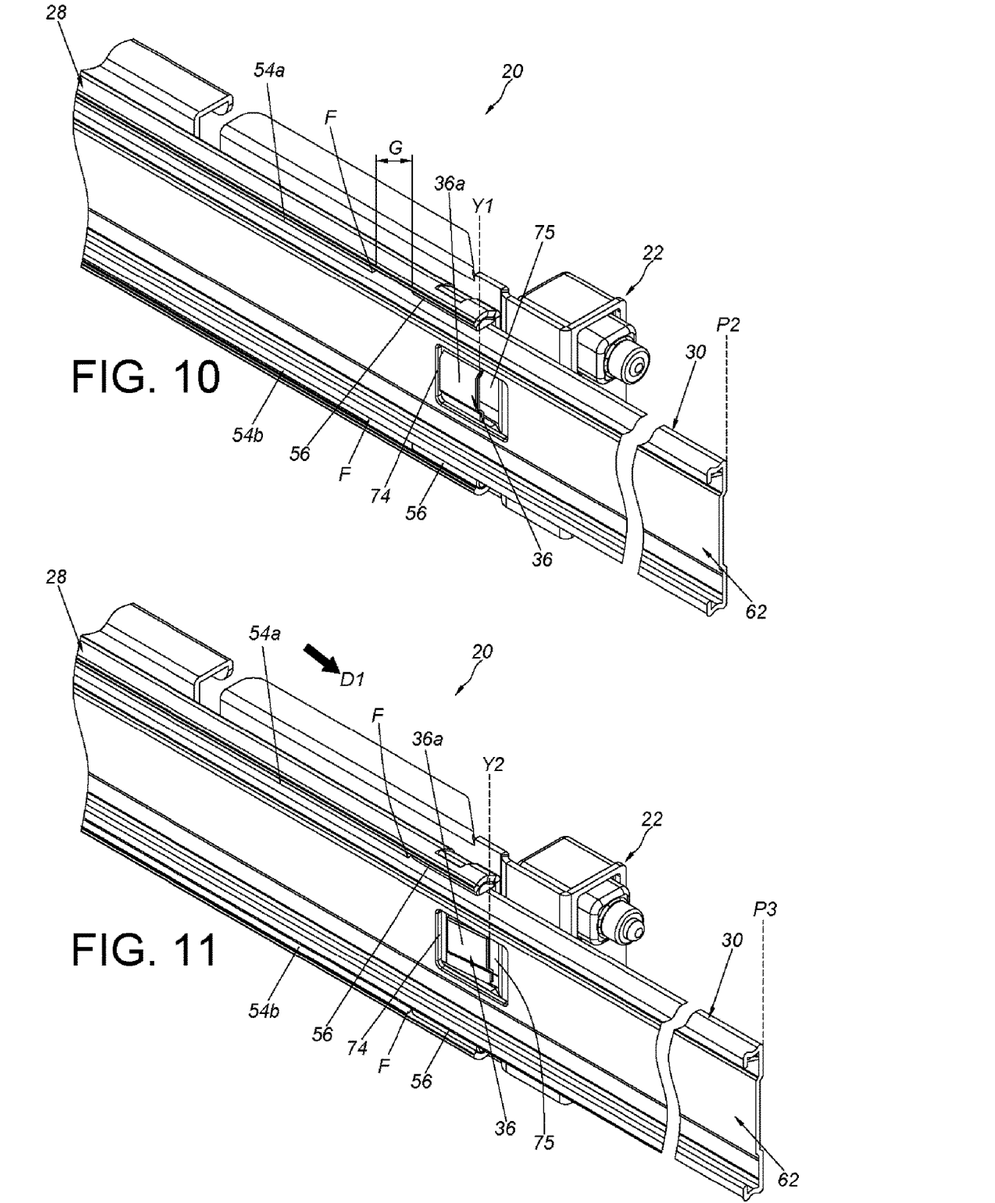
FIG. 10 is a perspective diagram showing the second rail located at the position and a portion of an operating member of the first rail engaging the second rail according to the embodiment of the present invention.
FIG. 11 is a perspective diagram showing the second rail located at the position and the operating member of the first rail operated such that the portion no longer engages the second rail according to the embodiment of the present invention.

Preferably, when the second rail 30 is located at the second position P2 relative to the first rail 28, positions of the through hole 75 and the second blocking portion 74 of the second rail 30 are corresponding to the first blocking portion 36a of the operating member 36 of the first rail 28, and the first blocking portion 36a of the operating member 36 is able to be located at a blocking position Y1 (this part can be referred to FIG. 10) in response to a resilient force of the resilient portion 36b so as to enable the first blocking portion 36a and the second blocking portion 74 to obstruct each other to prevent the second rail 30 from being moved relative to the first rail 28 from the second position P2 in the first direction D1.

Preferably, when the second rail 30 and the third rail 34 are located at the second position P2 relative to the first rail 28, the first severing feature 50 of the first rail 28 is configured to sever a synchronous relationship between the second rail 30 and the third rail 34. For example, the synchronizing member 38 deflects by an angle through contacting the incline 50a or the cambered surface of the first severing feature 50 to make the synchronizing feature 80 and the synchronizing member 38 no longer obstruct each other. In other words, the synchronizing member 38 is no longer in the initial state X1 (e.g. in another state X2) so as to sever the synchronous relationship between the second rail 30 and the third rail 34. Therefore, the third rail 34 can be further moved relative to the second rail 30 from the second position P2 in the first direction D1 and detached from the second rail 30 (this part can be referred to FIG. 10 where the third rail 34 has been detached from the passage 62 of the second rail 30). Wherein, the technique related to how to detach the third rail 34 from the second rail 30 is well known by those skilled in the art of the present invention. It is omitted hereby for simplicity.

It is notable when the second rail 30 is located at the second position P2 relative to the first rail 28, a clearance G is between the front ends F of the first bead strip 54a and the second bead strip 54b and the front blocking portion 56 of the first rail 28.

As shown in FIGS. 10-13, the second rail 30 can be moved relative to the first rail 28 from the second position P2 to a third position P3 (e.g. a second extending position). Preferably, the operating member 36 is operable to drive the first blocking portion 36a to leave the blocking position Y1 (e.g. to be located at a non-blocking position Y2, this part can be referred to FIG. 11 and FIG. 12) and no longer to obstruct the second blocking portion 74 of the second rail 30 such that the second rail 30 can be moved relative to the first rail 28 to a third position P3 in the first direction D1.

Figures 12, 13:
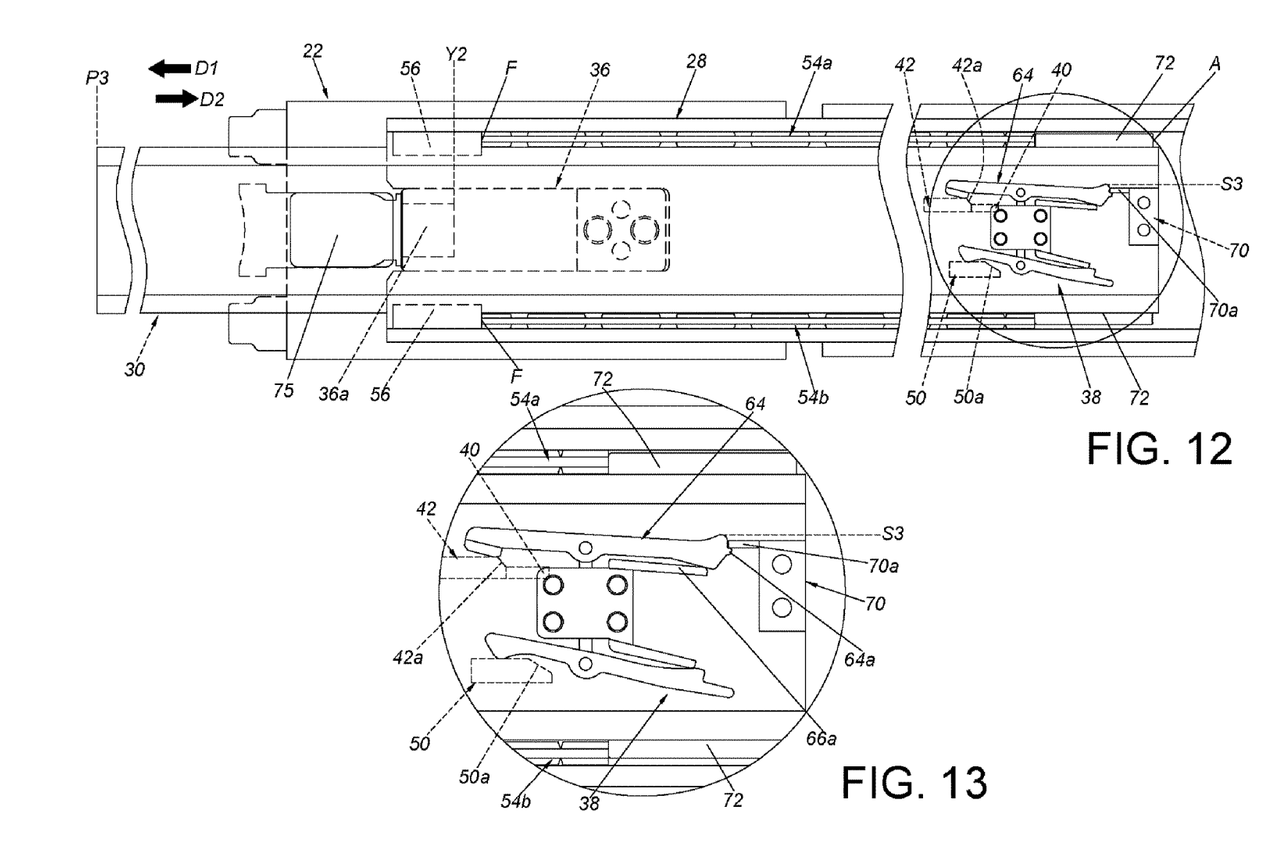
FIG. 12 is a diagram showing the second rail moved relative to the first rail from the position to another position in the first direction according to the embodiment of the present invention.
FIG. 13 is a partial enlarged diagram showing zone A in FIG. 12.

When the second rail 30 is moved relative to the first rail 28 from the second position P2 to the third position P3 by a distance substantially equal to the clearance G in the first direction D1, the positioning member 64 is moved from the engaging position S2 to a disengaging position S3 by guidance of the incline 42a or the cambered surface of the second structure 42 of the first rail 28 and no longer abuts against the first structure 40 of the first rail 28 (as shown in FIG. 12 or FIG. 13). During the process, the rear blocking portion 72 of the second rail 30 is able to drive the first bead strip 54a and the second bead strip 54b in the first direction D1 until the second rail 30 is located at the third position P3, and the front ends F of the first bead strip 54a and the second bead strip 54b have abutted against the front blocking portion 56 of the first rail 28 to prevent the second rail 30 from being further moved relative to the first rail 28 from the third position P3 in the first direction D1. It is notable that during the process where the positioning member 64 is moved from the engaging position S2 (as shown in FIG. 9) to the disengaging position S3 (as shown in FIG. 13), the extending section 64a of the positioning member 64 will cross a side of the flexible portion 70a of the holding member 70 and reach another side of the flexible portion 70a. Through a holding force of the flexible portion 70a of the holding member 70 exerted to the extending section 64a of the positioning member 64, the positioning member 64 is held in the disengaging position S3. Preferably, the holding force of the holding member 70 is greater than the elastic force of the first elastic section 66a of the elastic member 66.

Moreover, the second rail 30 is retractable relative to the first rail 28 from the third position P3 to the first position P1 in the second direction D2. Wherein, since the positioning member 64 is located at the disengaging position S3, the positioning member 64 does not engage with the first structure 40 of the first rail 28 when the second rail 30 is moved in the second direction D2.

It is notable if the second rail 30 is moved relative to the first rail 28 from the second position P2 to the third position P3 in the first direction D1, and the speed of the second rail 30 traveling from the third position P3 in the second direction D2 is fast enough such that the positioning member 64 is too late to respond the elastic force of the first elastic section 66a of the elastic member 66 and leaves the disengaging position S3, the second rail 30 can be also moved from the third position P3 in the second direction D2. In other words, it is not necessary to hold the positioning member 64 at the disengaging position S3 through the holding member 70 during implementation.

Figures 14, 15:
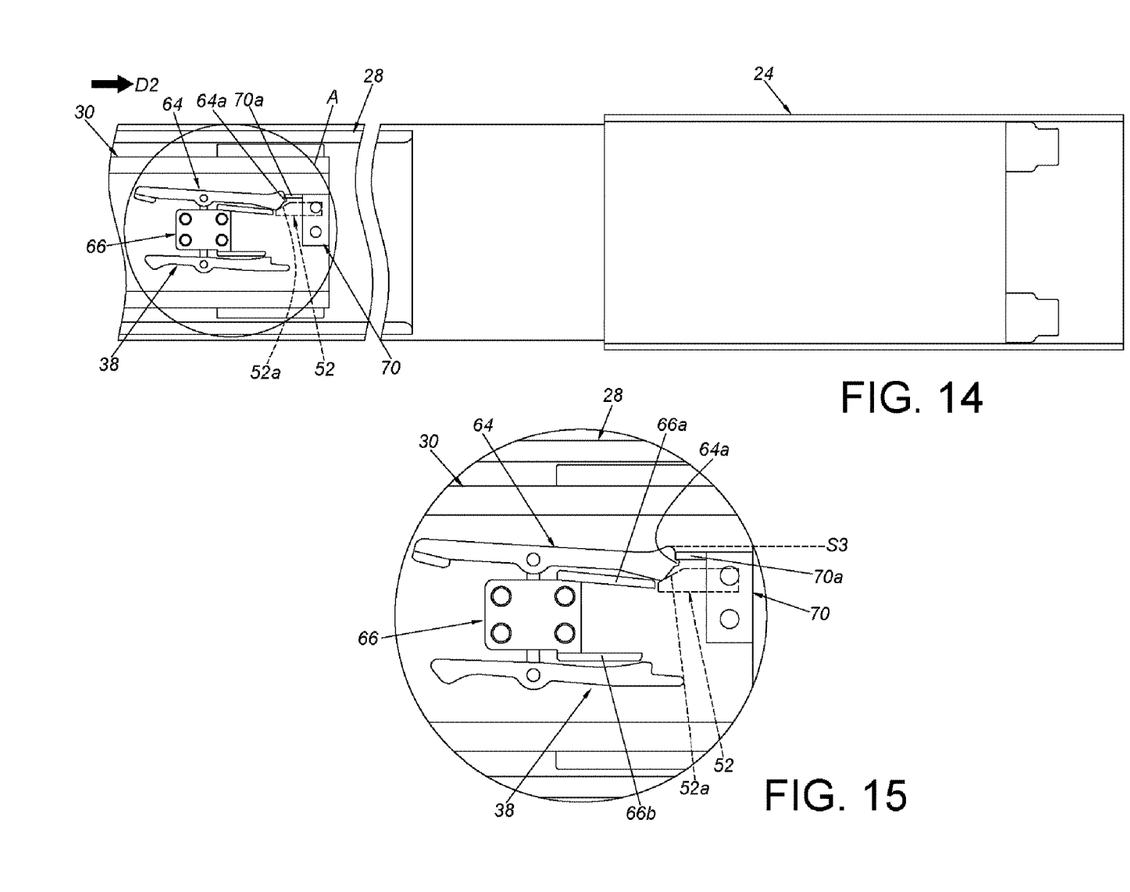
FIG. 14 is a diagram showing the second rail retracted relative to the first rail in a second direction according to the embodiment of the present invention.
FIG. 15 is a partial enlarged diagram showing zone A in FIG. 14.
Figure 16:
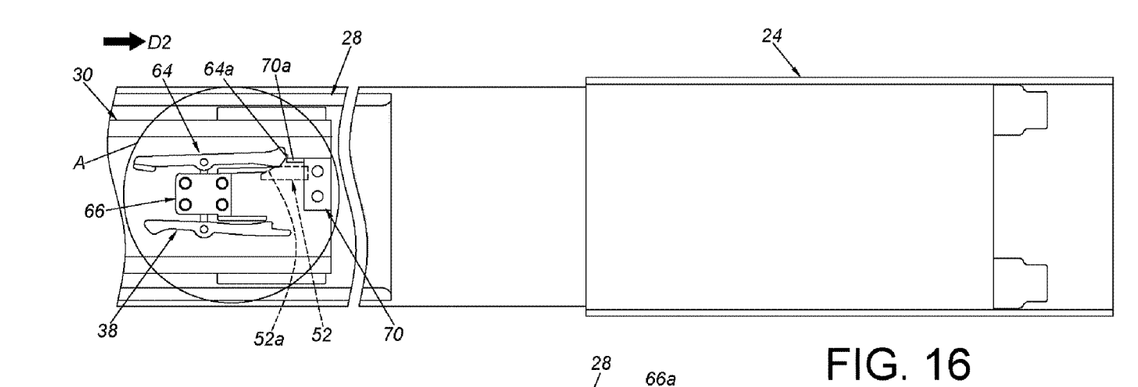
FIG. 16 is a diagram showing the second rail further retracted relative to the first rail in the second direction according to the embodiment of the present invention.
Figure 17:
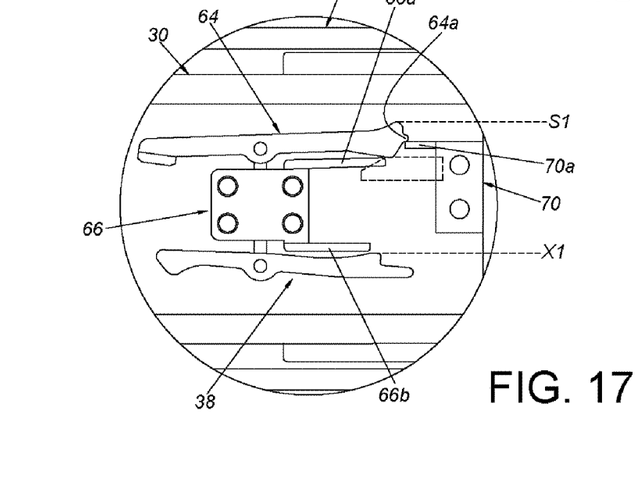
FIG. 17 is a partial enlarged diagram showing zone A in FIG. 16.

As shown in FIGS. 14-17, when the second rail 30 is moved relative to the first rail 28 to the first position P1 in the second direction D2 (this part can be referred to FIG. 6), the positioning member 64 is released from the holding force of the holding member 70 and moved from the disengaging position S3 back to the initial position S1 by guidance of the incline 52a or the cambered surface of the second severing feature 52 of the first rail 28 (this part can be referred to FIG. 6). It is notable that during the process where the positioning member 64 is moved from the disengaging position S3 (as shown in FIG. 15) to the initial position S1 (as shown in FIG. 17), the extending section 64a of the positioning member 64 is moved from the said another side of the flexible portion 70a of the holding member 70 back to the side of the flexible portion 70a. On the other hand, the synchronizing member 38 can recover to be in the initial state X1 in response to the elastic force generated by the second elastic section 66b of the elastic member 66.

Therefore, the slide rail assembly of the present invention is characterized in that:

1. Users do not need to stretch their hands to the rear of the second rail and are able to sever a synchronous relationship between the second rail 30 and the first rail 28 through operating a direction of the displacement with standing in front of the slide rail assembly. It facilitates the retraction of the second rail 30 relative to the first rail 28 and makes the operation faster and more convenient.

2. When the second rail 30 is moved relative to the first rail 28 from the first position P1 to the second position P2 in the first direction D1, the positioning member 64 is moved from the initial position S1 to the engaging position S2 and is able to abut against the first structure 40 of the first rail 28 through the elastic force released by the elastic member 66 to prevent the second rail 30 from being moved relative to the first rail 28 in the second direction D2. When the second rail 30 is moved relative to the first rail 28 from the second position P2 to the third position P3 in the first direction D1, the positioning member 64 is moved from the engaging position S2 to the disengaging position S3 and no longer abuts against the first structure 40 of the first rail 28 by the guidance of the second structure 42 of the first rail 28 to allow the second rail 30 to be moved relative to the first rail 28 in the second direction D2.

3. When the second rail 30 is located at the second position P2 relative to the first rail 28, the first blocking portion 36a of the operating member 36 is located at the blocking position Y1 and able to obstruct the second blocking portion 74 of the second rail 30 to prevent the second rail 30 from being moved relative to the first rail 28 in the first direction D1.

4. The operating member 36 is operable to drive the first blocking portion 36a to leave the blocking position Y1 and no longer to obstruct the second blocking portion 74 of the second rail 30 such that the second rail 30 is movable relative to the first rail 28 from the second position P2 to the third position P3 in the first direction D1. The positioning member 64 is moved from the engaging position S2 to the disengaging position S3 by the guidance of the second structure 42 of the first rail 28 and no longer abuts against the first structure 40 of the first rail 28.

5. When the second rail 30 is located at the second position P2 relative to the first rail 28, the clearance G is between the front ends F of the first bead strip 54a and the second bead strip 54b and the front blocking portion 56 of the first rail 28, and the second rail 30 is movable relative to the first rail 28 from the second position P2 to the third position P3 by a distance equal to the clearance G in the first direction D1.

6. When the second rail 30 is located at the third position P3 relative to the first rail 28, the rear blocking portion 72 of the second rail 30 is able to abut against the front blocking portion 56 of the first rail 28 through the front ends F of the first bead strip 54a and the second bead strip 54b to prevent the second rail 30 from being moved relative to the first rail 28 from the third position P3 in the first direction D1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail comprising a first structure and a second structure;
a second rail movable relative to the first rail;
a positioning device arranged to the second rail, the positioning device comprising an elastic member and a positioning member, the positioning member being located at an initial position in response to an elastic force generated by the elastic member; and
an operating member arranged to the first rail, the operating member comprising a first blocking portion, the second rail having a second blocking portion;
wherein when the second rail is moved relative to the first rail from a first position to a second position in a first direction, the positioning member is moved from the initial position to an engaging position through the elastic force released by the elastic member and abuts against the first structure of the first rail;
wherein when the second rail is moved relative to the first rail from the second position to a third position in the first direction, the positioning member is moved from the engaging position to a disengaging position by guidance of the second structure of the first rail and no longer abuts against the first structure of the first rail;
wherein when the second rail is moved relative to the first rail to the second position, the first blocking portion and the second blocking portion obstruct each other to prevent the second rail from being moved in the first direction.

2. The slide rail assembly of claim 1, further comprising a third rail movable relative to the second rail and a synchronizing member pivoted to the second rail, the third rail having a synchronizing feature, the second rail and the third rail being capable of being moved synchronously by means of abutting between the synchronizing feature and the synchronizing member.

3. The slide rail assembly of claim 2, wherein the first rail further comprising a first severing feature, when the second rail is located at the second position relative to the first rail, the first severing feature of the first rail is configured to sever a synchronous relationship between the second rail and the third rail.

4. The slide rail assembly of claim 3, wherein the first severing feature comprises an incline or a cambered surface, and the synchronizing member is deflectable through contacting the first severing feature to serve the synchronous relationship between the second rail and the third rail.

5. The slide rail assembly of claim 1, wherein the first structure is a hole or a concaved portion, the second structure is adjacent to the first structure, and the second structure comprises an incline or a cambered surface.

6. The slide rail assembly of claim 1, wherein the first position is a retracted position, the second position is a first extending position, and the third position is a second extending position.

7. The slide rail assembly of claim 1, further comprising a holding member arranged to the second rail, the positioning member being pivoted to the second rail, when the positioning member is located at the disengaging position, the positioning member can be held at the disengaging position by the holding member.

8. The slide rail assembly of claim 7, wherein the holding member has a flexible portion, the flexible portion is able to exert a holding force to the positioning member.

9. The slide rail assembly of claim 8, wherein the first rail further comprises a second severing feature, when the second rail is moved relative to the first rail to the first position in a second direction, the positioning member is released from the holding force and moved from the disengaging position back to the initial position by guidance of the second severing feature of the first rail.

10. The slide rail assembly of claim 9, wherein the second severing feature of the first rail comprises an incline or a cambered surface.

11. The slide rail assembly of claim 1, wherein the operating member is operable to drive the first blocking portion to leave the blocking position and no longer obstruct the second blocking portion of the second rail such that the second rail is movable relative to the first rail to the third position in the first direction.

12. The slide rail assembly of claim 11, further comprising an auxiliary sliding device arranged between the first rail and the second rail, the auxiliary sliding device comprising a pair of bead strips, each bead strip comprising a plurality of balls configured to support the first rail and the second rail.

13. The slide rail assembly of claim 12, wherein the second rail has a rear blocking portion corresponding to a rear end of the each bead strip, the first rail has a front blocking portion corresponding to a front end of the each bead strip, the each bead strip is located between the front blocking portion of the first rail and the rear blocking portion of the second rail, when the second rail is located at the second position relative to the first rail, a clearance is between the front end of the each bead strip and the front blocking portion of the first rail.

14. A slide rail assembly, comprising:
a first rail comprising a first structure, a second structure and a first severing feature;
a second rail movable relative to the first rail;
a third rail movable relative to the second rail, the third rail having a synchronizing feature;
an operating member arranged to the first rail, the operating member comprising a first blocking portion, the second rail having a second blocking portion;
a positioning device arranged to the second rail, the positioning device comprising an elastic member and a positioning member, the positioning member being located at an initial position in response to an elastic force generated by the elastic member; and
a synchronizing member arranged to the second rail;
wherein the second rail and the third rail are movable relative to the first rail synchronously from a first position to a second position in a first direction by means of abutting between the synchronizing feature and the synchronizing member until the first severing feature of the first rail severs a synchronous relationship between the second rail and the third rail;
wherein when the second rail and the third rail are at the second position, the positioning member is moved from the initial position to an engaging position through the elastic force released by the elastic member and abuts against the first structure of the first rail to prevent the second rail from being moved relative to the first rail in a second direction, and when the first blocking portion of the operating member is located at a blocking position, the first blocking portion and the second blocking portion are able to obstruct each other to prevent the second rail from being moved in the first direction;
wherein the operating member is operable to drive the first blocking portion to leave the blocking position and no longer obstruct the second blocking portion such that the second rail is movable relative to the first rail to a third position in the first direction, the positioning member is moved from the engaging position to a disengaging position by guidance of the second structure of the first rail and no longer abuts against the first structure of the first rail.

15. The slide rail assembly of claim 14, wherein the positioning member is pivoted to the second rail, when the positioning member is located at the disengaging position, the positioning member can be held at the disengaging position by a holding member.

16. The slide rail assembly of claim 15, wherein the holding member has a flexible portion, the flexible portion exerts a holding force to the positioning member.

17. The slide rail assembly of claim 14, wherein the first rail comprises a second severing feature, when the second rail is moved relative to the first rail to the first position in the second direction, the positioning member is moved from the disengaging position back to the initial position by guidance of the second severing feature of the first rail.

18. The slide rail assembly of claim 14, further comprising an auxiliary sliding device arranged between the first rail and the second rail, the auxiliary sliding device comprising a pair of bead strips, each bead strip comprising a plurality of balls configured to support the first rail and the second rail.

19. The slide rail assembly of claim 18, wherein the second rail has a rear blocking portion corresponding to a rear end of the each bead strip, the first rail has a front blocking portion corresponding to a front end of the each bead strip, the each bead strip is located between the front blocking portion of the first rail and the rear blocking portion of the second rail, when the second rail is located at the second position relative to the first rail, a clearance is between the front end of the each bead strip and the front blocking portion of the first rail.

* * * * *